United States Patent [19]

Hargis

[11] 4,224,637
[45] Sep. 23, 1980

[54] LEADED MOUNTING AND CONNECTOR UNIT FOR AN ELECTRONIC DEVICE

[75] Inventor: Billy M. Hargis, Hugo, Minn.

[73] Assignee: Minnesota Mining and Manufacturing Company, St. Paul, Minn.

[21] Appl. No.: 932,609

[22] Filed: Aug. 10, 1978

[51] Int. Cl.² .............. H01L 23/02; H01L 23/12; H01L 39/02
[52] U.S. Cl. ............................. 357/74; 357/70; 357/80; 339/176 R; 339/176 M; 174/52 FP
[58] Field of Search ............. 357/74, 75, 70, 80; 339/17, 176; 174/52 FP

[56] References Cited

U.S. PATENT DOCUMENTS

| | | | |
|---|---|---|---|
| 3,617,819 | 11/1971 | Boisvert | 357/74 |
| 3,700,788 | 10/1972 | Spurck | 357/74 |
| 3,735,214 | 5/1973 | Renskers | 357/74 |
| 3,784,948 | 1/1974 | Johnston et al. | 357/74 |
| 3,789,341 | 1/1974 | Dalmasso | 357/74 |
| 3,803,458 | 4/1974 | Morena | 357/74 |
| 4,139,726 | 2/1979 | Penrod et al. | 357/74 |
| 4,142,203 | 2/1979 | Dietz | 357/74 |

*Primary Examiner*—Andrew J. James
*Attorney, Agent, or Firm*—Cruzan Alexander; Donald M. Sell; Robert L. Marben

[57] ABSTRACT

A leaded mounting and connector unit for an electronic device wherein the unit includes a structure having two parallel sides and a plurality of metallized areas which connect with spaced metallized areas provided at the parallel sides to which terminal leads are bonded. Grooves provided in the two sides receive the terminal leads which, in some cases, can extend beyond the sides serving to locate a cover or locate and connect with a leadless structure positioned above the leaded unit. The terminal leads are provided with tab members for locating the leads relative to the structure and to locate a leadless structure at a position above the leaded unit.

13 Claims, 5 Drawing Figures

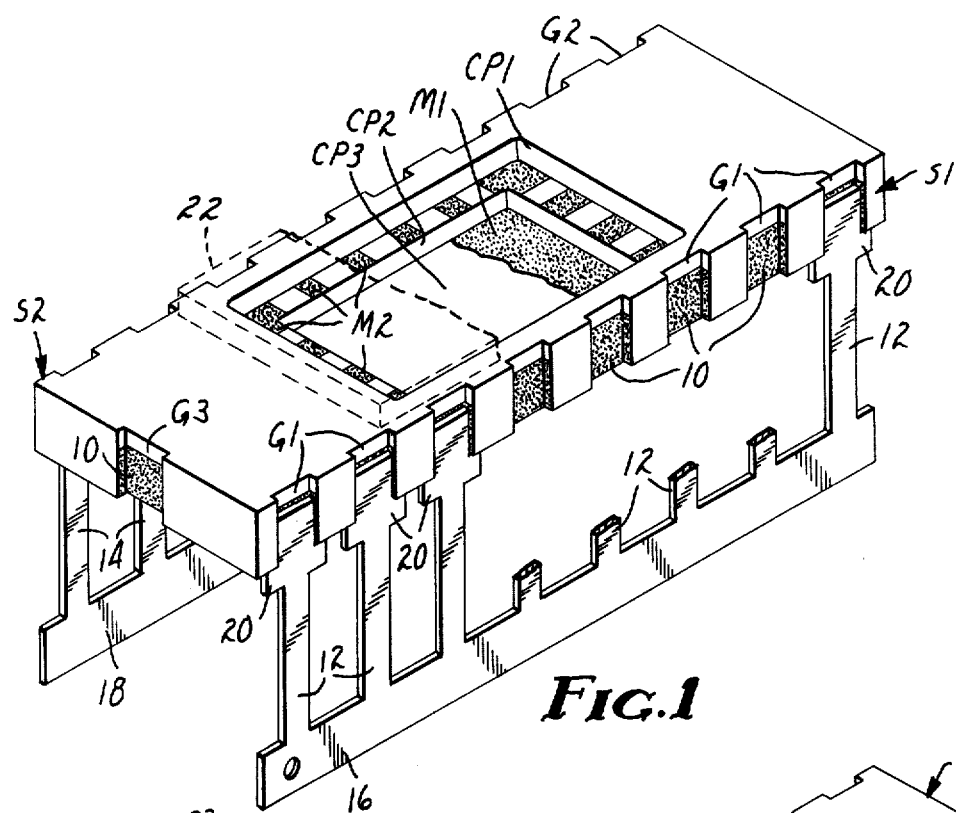
FIG. 1
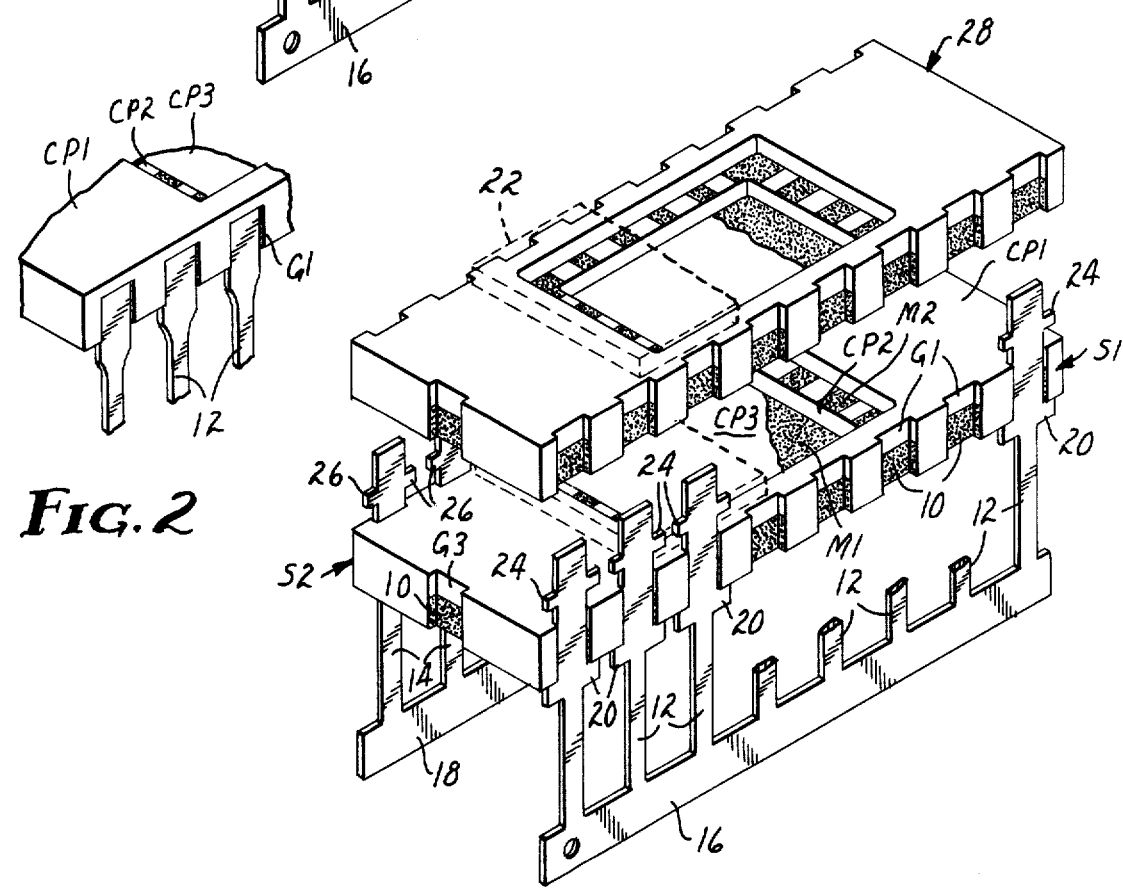
FIG. 2
FIG. 4

LEADED MOUNTING AND CONNECTOR UNIT FOR AN ELECTRONIC DEVICE

BACKGROUND OF THE INVENTION

1. Field of the Invention

The invention relates to an improved leaded mounting and connector unit for an electronic device wherein the unit includes a structure having two parallel opposed sides and a plurality of metallized areas which connect with spaced metallized areas provided at the parallel sides to which terminal leads are bonded.

2. Description of the Prior Art

Leaded mounting and connector units for electronic devices are known which are formed from two or more sheets of ceramic particulate, hereinafter referred to as green ceramic sheets, wherein at least one of the sheets have metallized areas. A portion of the metallized areas, which are first plated so conductors can be bonded to it, are used for making connections with an electrode device(s) when it is mounted on the unit with such portions connecting with metallized portions that extend to various edge portions of the sheet. The metallized portions can be on one or more of the sheets. Prior to firing for densification of the sheets, selected spaced areas along the edges of some of the sheets are metallized to make electrical contact with selected metallized areas carried on the major surface of a ceramic green sheet which extend to the edge of the sheet. Such sheets are usually first superimposed on one another in a desired order and the selected edge portions then metallized. Any other additional green ceramic sheets required for the unit are then superimposed on the other sheets and the layered structure is laminated by pressure or pressure and heat prior to heating to densify the ceramic to form a monolithic structure. Leaded mounting and connector units of the type commonly referred to as side brazed dual in-line units, have been made in this manner. The edge portions of the sheets that receive the metallization in such prior art units present essentially flat side walls. The edge metallized areas are spaced apart in accordance with industry standards. In order to provide improved braze wetting, the edge metallized areas are plated with an acceptable metal such as nickel. Terminal leads, which are secured together at one end by a tie bar, have a portion at the other end of each lead positioned opposite the edge metallized areas where they are secured to the plated metallized portions by brazing. In order to maintain alignment of the leads with respect to the edge metallized portions and eliminate expensive brazing fixtures, the leads are formed from metals having essentially the same coefficient of expansion as the densified ceramic such as iron-nickel-cobalt alloy known by the tradename "Kovar." Standardization of dual in-line units has required the placement and bonding of a set of terminal leads on one side directly opposite a set of leads bonded on the other side, with the same spacing between the leads of each set. Such placement is made at times by using cross tie bars which extend between the two sets of terminal leads.

The prior art structure presents problems with respect to the control of the width and placement of the edge metallization pattern and expensive lead frames or extensive braze fixtures are required to insure alignment of the leads to both the edge metallization areas and to the opposing row of leads. This makes the brazing operation for securing the terminal leads labor intensive, expensive and creates defects that reduce yields.

Further, such prior art leaded mounting and connector units for electronic devices have only limited circuit packaging density which is provided in those units where more than one electronic device may be mounted on a single unit.

SUMMARY OF THE INVENTION

The problems presented with respect to the prior art structure are solved by the present invention which provides an improved leaded mounting and connector unit for an electronic device or devices wherein the unit is one which is formed from at least two or more sheets of green ceramic that are laminated by pressure or pressure and heat and then fired to form a monolithic structure with at least one of the sheets having a plurality of metallized areas, the structure presenting two parallel opposed sides, each side having metallized areas to which terminal leads having a tie bar are bonded. An improvement resides in each of the two parallel sides having a plurality of grooves, which are preferably flat bottomed, which extend generally parallel to the sides and generally perpendicular to the sheets at which the metallized areas for the terminal leads are located. With this structure, the terminal leads can be of metal which does not have substantially the same coefficient of expansion as the sheet material. This provides a cost reduction in providing the terminal leads.

Another improvement resides in at least two of the terminal leads for each side having at least one tab member defining a width for the lead that exceeds the width of the groove receiving the lead, such tab member serving to position the leads lengthwise of the grooves.

An improvement serving to position the leads lengthwise of the grooves resides in the structure having grooves in the two parallel sides with the grooves closed at one end. The closed end of each groove serves to limit the portion of the terminal leads that can be received in the groove to aid in the placement of the terminal leads on the structure.

Another improvement resides in an embodiment wherein at least two of the terminal leads for each of two opposed grooved sides have an extended portion opposite the lead end which extends beyond the groove for the leads, two adjacent extended portions for each side, for example, being usable after an electronic device is mounted on the unit for locating a cover member for the electronic device, the cover member having protrusions keyed to two adjacent extended portions at each of the two opposed sides.

Another improvement resides in an embodiment wherein each terminal lead for the two opposed sides extends beyond both ends of the grooves for the terminals, each portion of a terminal extending beyond one end being usable as the male portion of a male-female connection with the terminal portions extending beyond the other end of the grooves being usable for locating and bonding the leads in electrical connection with one or more leadless units having two opposed sides with grooves corresponding to the grooves of the leaded unit. The latter portions of at least two of the terminal leads for each side have at least one tab member at one or more selected points along the leads to establish the spacing of a leadless unit or units from the leaded unit.

In an embodiment of a leaded mounting and connection unit wherein the unit includes a structure having two parallel opposed sides that are essentially flat to which the terminal leads are bonded to spaced metallized areas on the sides, an improvement resides wherein at least two terminal leads for each of the two parallel opposed sides each have an extended portion opposite the lead end, which extends beyond the structure, two adjacent extended portions for each side, for example, being usable after an electronic device is mounted on the unit for locating a cover member for the electronic device, the cover member having protrusions keyed to two adjacent extended portions at each of the two sides.

A further improvement resides in an embodiment of a leading mounting and connection unit wherein the two parallel opposed sides provided by the structure are essentially flat with terminal leads bonded to spaced metallized areas on the two sides, each terminal lead having an extended portion opposite the lead end which extends beyond the structure which are usable for bonding to a metallized edge portion of one or more leadless units with at least two extended portions for each side having at least one locating tab member to establish the spacing of a leadless unit from the leaded unit wherein the leadless unit has sides with metallized grooves to which the terminal leads of the leaded unit can be bonded. By using tab members which are directed inwardly of the unit, the leadless unit can be of the type having flat sides to which the terminal leads of the leaded unit are bonded. With either arrangement, at least one tab member directed inwardly of the leaded unit for at least two of the terminal leads for each of the two sides can be used to position the structure for the leaded unit lengthwise of the terminal leads.

BRIEF DESCRIPTION OF THE DRAWINGS

The broad aspects of the invention having been described, the invention will be described in greater detail by reference to the drawings wherein:

FIG. 1 is a perspective view of one leaded mounting and connector unit embodying the present invention;

FIG. 2 is a partial perspective view depicting a modification of the unit shown in FIG. 1;

FIG. 4 is a perspective view of a leaded mounting and connector unit depicting a modification of the unit shown in FIG. 1 together with a leadless unit.

DETAILED DESCRIPTION

Figure 3:
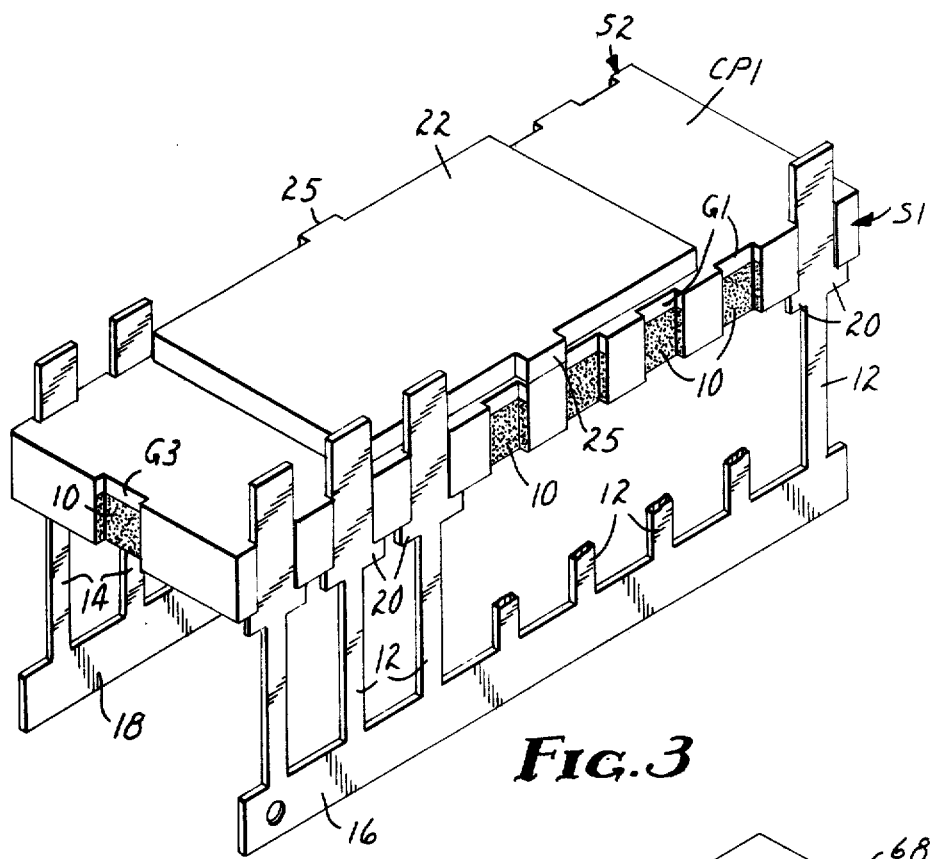
FIG. 3 is a perspective view of a leaded mounting and connector unit depicting a modification of the unit shown in FIG. 1 with a cover positioned on the unit.

Referring to FIG. 1, a leaded mounting and connection unit for an electronic device, particularly, an integrated semiconductor circuit that is contained in a single semiconductor chip, is illustrated which embodies the invention. The unit of FIG. 1 is formed from three layers CP1, CP2 and CP3 provided from three sheets of green ceramic material which, after having certain areas metallized, as will be discussed, are superimposed on one another, laminated by pressure or pressure and heat and are then densified by heating the layers to form a monolithic structure.

The layers or sheets CP1, CP2 and CP3 are formed from green ceramic material so their edges present two opposite sides S1 and S2 of the unit, which are castellated to provide a number of open-ended grooves G1 at side S1, which are preferably flat bottomed, with an equal number of similar grooves G2 at side S2, which are positioned directly opposite the grooves G1. The grooves extend the thickness of the three layers CP1, CP2 and CP3 and are generally parallel to the sides and perpendiuclar to the plane upper surface of layer CP1. Grooves similar to grooves G1 and G2 can also be provided in the sides connecting sides S1 and S2, if required. This is illustrated by the groove G3.

The upper layer CP1 is formed with a generally central opening which, in FIG. 1, is illustrated as rectangular in form, with a similarly shaped, but smaller, opening in the adjoining layer CP2, allowing the inner peripheral portion of the layer CP2 at its central opening to remain exposed when layer CP1 is positioned on layer CP2.

The upper central exposed area of the lower layer CP3 is usually metallized to include the entire exposed area. Metallizing materials and its application to selected areas of green ceramic is well known in the art. Such metallization is only shown in part by the portion indicated at M1. Selected portions of the upper surface of layer CP2 are also metallized as indicated at M2. The metallized areas M2 are placed on the layer CP2 before layer CP1 is placed in position over layer CP2. Though not shown in FIG. 1, the metallized areas M2 form discrete conductive paths which extend to the edge of layer CP2 at the various grooves G1, G2 and G3, as required. Following densification of the superimposed green ceramic layers CP1, CP2 and CP3, the exposed portions of the metallized areas M1 and M2 are usually nickel plated and then silver or gold plated.

The surface of the portion of grooves G1, G2 and G3 formed when layer CP2 is superimposed on layer CP3 are metallized as indicated at 10 to complete an electrical path from each groove to any metallized portion M2 that extends to the edge portion of layer CP2 defining the grooves. The metallized areas 10 of the grooves, which can include the sides of the grooves, are plated with a suitable metal such as nickel. The metal used for plating of the metallized areas 10 serves to improve braze wetting, which is desirable, since the terminal leads 12 and 14, which are disposed in grooves G1 and G2, respectively, are normally physically and electrically bonded to metallized areas 10 provided in the grooves by brazing.

The grooves G1 and G2 serve to accurately locate the metallized areas 10 needed on sides S1 and S2 and simplify the positioning of the terminal leads 12 and 14 opposite the metallized areas. For ease of handling, the terminal leads 12, when formed, are joined at one end by a tie bar 16 with a tie bar 18 similarly provided for terminal leads 14. The other ends of the leads 12 and 14 are received in the grooves G1 and G2, respectively.

The grooves G1 and G2 also serve to confine the leads 12 and 14 during the brazing operation required to braze the leads 12 and 14 to the metallized areas 10 in the grooves. This confinement of the leads in position enables the leads 12 and 14 to be formed from metals which do not have essentially the same coefficient of expansion as the ceramic material for layers CP1, CP2 and CP3. Such metals as iron, nickel, copper, or alloys thereof, for example, are suitable. When the leads 12 and 14 are brazed to metallized areas along a side that does not have grooves, it is necessary, in the absence of special jigs for maintaining the leads in position, that the lead terminals be made of metal which has a coefficient of expansion that is essentially the same as the ceramic, such as an iron-nickel-cobalt alloy known by the tradename "Kovar."

Another feature provided by the terminal leads 12 is the tab members 20 which extend outwardly from opposite sides of the leads in a plane that is parallel to the sides S1 and S2 of the unit. These tabs serve to determine the extent to which the terminal leads 12 are extended into the grooves G1 to simplify the assembly and brazing procedure by reducing the need for expensive assembly jigs or fixtures. Similar tabs (not shown) are also provided on the terminal leads 14.

FIG. 2 shows a portion of the structure of FIG. 1 illustrating an alternative arrangement for the positioning of the terminal leads 12 and 14 in the grooves. Layer CP1 is extended to close off one end of the grooves G1 and G2. The layer CP1 then serves as a stop for the terminal leads 12 and 14 and eliminates the need for the tabs 20 on the leads 12, as well as the similar tabs on leads 14 (not shown).

Referring once again to FIG. 1, it will be noted that a cover 22 indicated by the dotted line outline is shown. A cover is applied to a leaded mounting and connector unit after an electronic device (not shown) has been mounted on layer CP3 of the unit within the central recess area provided by the layers CP1 and CP2 and conductors (not shown) bonded to the appropriate points of the device and the various metallized areas M2. FIG. 3 shows a portion of the structure of FIG. 1 which is modified by the use of leads 12 and 14, each having a portion that extends for a short distance above the upper surface defined by the layer CP1. A cover 22 of nonconductive material is also shown in position having protrusions 25, one for each of two opposite sides of the cover adjacent sides S1 and S2 of the unit. The protrusions 25 extend generally perpendicular to the sides of the cover and in the direction of the plane defined by the upper surface of the cover. The cover is positioned on the layer CP1 with one of the protrusions 25 presented between the extended portions of two adjacent terminal leads 12 and with the other protrusion 25 presented between two adjacent terminal leads 14 to key the cover in position to provide accurate placement of the cover 22 on layer CP1. The cover 22 is permanently positioned in place by a suitable manner such as a glass or adhesive seal provided at the peripheral edge of the cover that is in contact with layer CP1.

Referring to FIG. 4, another modification of the arrangement of FIG. 1 is shown wherein the terminal leads 12 and 14 extend beyond the upper surface of the layer CP1 and at a greater distance than is the case for the arrangement shown in FIG. 3 with tabs 24, which extend from opposite side edges of terminal leads 12, provided on each of the upwardly extended portions of terminal leads 12 at a point above the layer CP1. The tabs 24 are similar to the tabs 20. Similar tabs 26 are provided on each of the terminal leads 14 at the same point on the upwardly extended portions of terminal leads 14.

A leadless mounting and connector unit for electronic devices similar to the ceramic structure portion of the leaded unit described in connection with FIG. 1 is shown at 28 in FIG. 4 to illustrate the use of the leaded unit shown in FIG. 4. The leadless unit 28 can be placed so the upwardly extended portions of the terminal leads 12 and 14 are received in the grooves provided in the unit 28 with the protrusions which define the grooves in the unit 28 resting on the tabs 24 and 26 to position the unit 28 above the lower leaded unit. The portion of the terminal leads 12 and 14 positioned in the grooves in unit 28 can then be soldered to the plated metallized portion of the grooves of unit 28. While not shown, an electronic device would first be mounted on the lower leaded unit and an electrode device (not shown) could be mounted on the unit 28 either before or after it is secured to the terminal leads 12 and 14.

Figure 5:
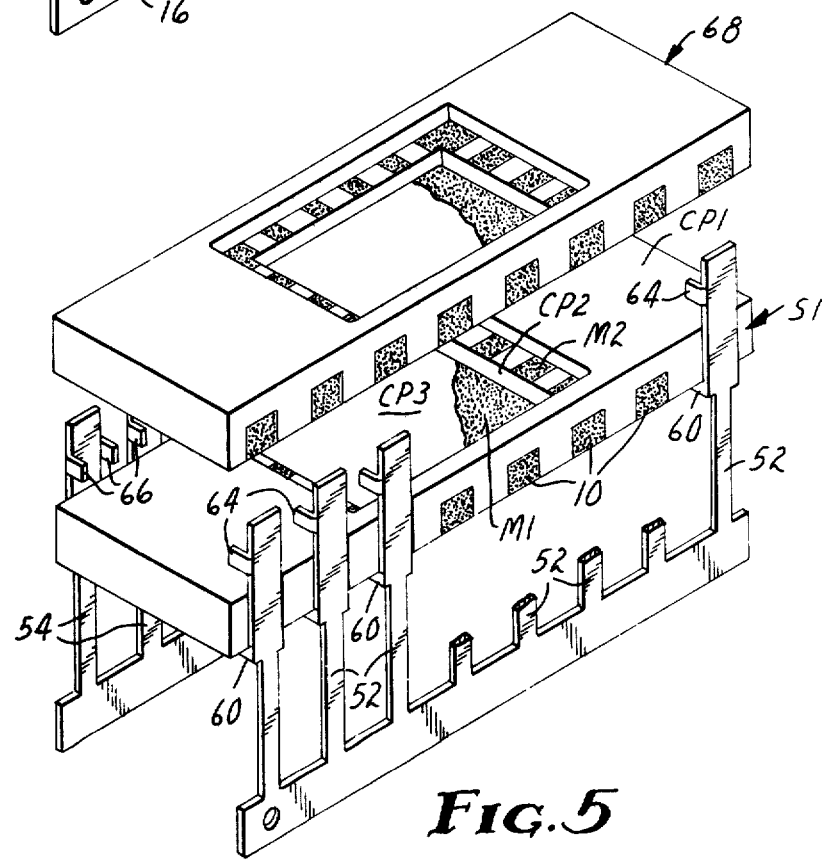
FIG. 5 is a perspective view of a leaded mounting and connector unit depicting a modification of the unit shown in FIG. 4 together with a modified showing of the leadless unit of FIG. 4.

While the stacking of one or more leadless units with a leaded unit, as described in connection with FIG. 4, requires units in which the terminal leads are positioned in grooves, FIG. 5 shows an alternative ceramic structure for the leaded unit wherein the layers CP1, CP2 and CP3 are formed with straight edges to present two opposite sides S1 and S2 of the unit which are flat and have plated metallized areas 10, corresponding to the plated metallized areas of the structure shown in FIG. 1, placed on the flat surface presented by sides S1 and S2. Terminal leads 52 and 54 are provided which correspond to terminal leads 12 and 14 of FIG. 4 are bonded by brazing to the plated metallized areas 10 on the sides S1 and S2 and are similarly structured, except that tabs 60 and 64 for terminal leads 52, which correspond to tabs 20 and 24, respectively, of terminal leads 12 and tabs 66, which correspond to tabs 26 of terminal leads 14, are turned inwardly of the unit. The terminal leads 54 also have tabs (not shown) which correspond to tabs 60 of terminal leads 52. The tabs 60 of terminal leads 52 and the corresponding tabs (not shown) on terminal leads 54 rest on the bottom of the unit provided by layer CP1 and serve to help position the terminal leads 52 and 54 relative to the sides S1 and S2. The tabs 64 and 66 are used to receive and position a unit 68 relative to the upwardly extending portions of terminal leads 52 and 54 to position the unit 68 above the lower leaded unit. The unit 68 is similar to the leaded unit described in connection with FIG. 5 and presents flat opposed sides at which plated metallized areas are presented and positioned opposite the terminal leads 52 and 54 to which the terminal leads are bonded in a suitable manner, such as by soldering. Electronic devices (not shown) would be mounted in a manner similar to that described in connection with the arrangement shown in FIG. 4.

In view of the description given with respect to FIG. 4 setting forth the function of tab members 24 and 26 for positioning a grooved leadless unit 28 above the leaded unit, it can be appreciated that the tab members 64 and 66 described for the terminal leads 52 and 54, respectively, in FIG. 5 can be of the same form as tab members 24 and 26 in which case a grooved leadless unit can be positioned above the flat sided leaded unit of FIG. 5. Similarly, the tab members 24 and 26 for terminal leads 12 and 14 of FIG. 4 could take on the form for the tab members 64 and 66 for the terminal lead structure of FIG. 5 allowing a leadless unit having two flat parallel opposed sides rather than grooved sides to be positioned above the grooved leaded unit of FIG. 4.

While a mounting unit having a structure formed from three layers of green ceramic has been described, structures formed from one or more than three layers can be utilized with the mounting arrangements for the various terminal leads as described for the several embodiments in the drawings. Further, the invention presented herein is not limited to the specific form presented with respect to the various metallized areas provided on the layers as shown from which the ceramic structures are formed. The description given with respect to the metallized areas was only representative of one type of arrangement for the metallized areas that can be used and many others can be found in the prior art to which the invention presented herein is applicable.

What is claimed is:

1. An improved mounting and connector unit for an electronic device or devices, the unit including a structure having two parallel opposed sides and a plurality of metallized areas; a plurality of spaced metallized areas positioned on both of the two parallel sides and making connection with any of the plurality of metallized areas which extend to the spaced metallized areas; two sets of a plurality of terminal leads, one set for each of the opposite sides with each of the leads physically are electrically bonded to a different one of the spaced metallized areas and extending from the structure in the same general direction; a tie bar, one for each of the two sets of terminal leads, joining the terminal leads at one end, the improvement wherein at least one of the terminal leads for each of the two sets have a straight, flat portion that extends beyond said parallel sides in the direction away from the tie bars.

2. An improved mounting and connector unit for an electronic device or devices in accordance with claim 1 wherein said terminal leads having a portion that extends beyond the sides in the direction opposite the tie bar, each having a tab spaced from the tie bar and directed inwardly of the structure and the structure presenting a surface that engages said tab.

3. An improved mounting and connector unit for an electronic device or devices in accordance with claim 1 wherein said terminal leads having a straight, flat portion that extends beyond the sides in the direction away from the tie bars, each have at least two tabs, each of said two tabs directed inwardly of the structure, one tab adjacent the tie bar, the other of said two tabs spaced from the structure; and the structure presenting a surface that engages said one tab.

4. An improved mounting and connector unit for an electronic device or devices in accordance with claim 1 wherein said terminal leads having a straight, flat portion that extends beyond the sides in the direction away from the tie bars, each have at least two tabs, one of said tabs adjacent the tie bar and directed inwardly of the structure, the other of said two tabs spaced from the structure; and the structure presenting a surface that engages said one tab.

5. An improved mounting and connector unit for an electronic device or devices in accordance with claim 1 wherein the two parallel opposed sides have a plurality of grooves with one of the plurality of spaced metallized areas positioned in each of said grooves and each of the terminal leads bonded to a spaced metallized area having a portion positioned within the groove for the spaced metallized area.

6. An improved mounting and connector unit for an electronic device or devices in accordance with claim 5 wherein said terminal leads having a portion that extends beyond the sides in the direction opposite the tie bars, each have a tab spaced from the tie bar and in engagement with the structure at the tie bar end of the groove in which the terminal lead is positioned.

7. An improved mounting and connector unit for an electronic device and devices in accordance with claim 5 wherein said terminal leads having a portion that extends beyond the sides in the direction opposite the tie bars, each have at least two tabs, one spaced from the tie bar and in engagement with the structure at the tie bar end of the groove in which the terminal lead is positioned and the other of said tabs spaced from the 8. An improved mounting and connector unit for an electronic device or devices in accordance with claim 7 wherein said other of said tabs is directed inwardly of the structure.

9. An improved mounting and connector unit for an electronic device or devices in accordance with claim 5 wherein the terminal leads are formed from a metal that has a coefficient of expansion that is not essentially the same as the coefficient of expansion of the material for the structure.

10. An improved mounting and connector unit for an electronic device or devices, the unit including a structure having two parallel opposed sides and a plurality of metallized areas; a plurality of spaced metallized areas positioned on both of the two parallel sides and making connection with any of the plurality of metallized areas which extend to the spaced metallized areas; two sets of a plurality of terminal leads, one set for each of the opposite sides with each of the leads physically and electrically bonded to a different one of the spaced metallized areas and extending in the same general direction and perpendicular to the sheets; a tie bar, one for each of the two sets of terminal leads, joining the terminal leads at one end, the improvement wherein the two parallel opposed sides have a plurality of grooves with one of the plurality of spaced metallized areas positioned in each of said grooves and each of the terminal leads bonded to a spaced metallized area having a portion positioned within the groove.

11. An improved mounting and connector unit for an electronic device or devices in accordance with claim 10 wherein at least two of the terminal leads for each of the two sides each have a tab spaced from the tie bar and in engagement with the structure at the tie bar end of the groove in which the terminal lead is positioned.

12. An improved mounting and connector unit for an electronic device or devices in accordance with claim 10 wherein said plurality of grooves are closed at one end and said portion is positioned in abutting relationship with the closed end of the groove.

13. An improved mounting and connector unit for an electronic device or devices in accordance with claim 10 wherein the terminal leads are formed from a metal that has a coefficient of expansion that is not essentially the same as the coefficient of expansion of the material for the structure.

* * * * *